United States Patent

Goeoetz et al.

(10) Patent No.: US 10,665,760 B2
(45) Date of Patent: May 26, 2020

(54) METHOD FOR PRODUCING AT LEAST ONE OPTOELECTRONIC SEMICONDUCTOR COMPONENT AND OPTOELECTRONIC SEMICONDUCTOR COMPONENT

(71) Applicant: OSRAM Opto Semiconductors GmbH, Regensburg (DE)

(72) Inventors: Britta Goeoetz, Regensburg (DE); Alexander Behres, Pfatter (DE); Darshan Kundaliya, Beverly, MA (US)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 26 days.

(21) Appl. No.: 15/816,924

(22) Filed: Nov. 17, 2017

(65) Prior Publication Data

US 2018/0158993 A1 Jun. 7, 2018

Related U.S. Application Data

(60) Provisional application No. 62/425,574, filed on Nov. 22, 2016.

(51) Int. Cl.
*H01L 33/50* (2010.01)
*H01L 33/00* (2010.01)
*H01L 33/08* (2010.01)

(52) U.S. Cl.
CPC ........ *H01L 33/502* (2013.01); *H01L 33/0075* (2013.01); *H01L 33/505* (2013.01); *H01L 33/08* (2013.01); *H01L 33/508* (2013.01); *H01L 2933/0041* (2013.01)

(58) Field of Classification Search
None
See application file for complete search history.

(56) References Cited

U.S. PATENT DOCUMENTS

| | | | |
|---|---|---|---|
| 2008/0191203 A1* | 8/2008 | Fujioka | C23C 14/0617 257/43 |
| 2009/0039375 A1 | 2/2009 | LeToquin et al. | |
| 2009/0078955 A1* | 3/2009 | Fan | H01L 27/15 257/98 |
| 2010/0051939 A1* | 3/2010 | Shinagawa | H01S 5/32341 257/43 |
| 2010/0090232 A1* | 4/2010 | Huang | H01L 33/08 257/89 |

(Continued)

FOREIGN PATENT DOCUMENTS

WO 2015038386 A 3/2015

*Primary Examiner* — Samuel A Gebremariam
*Assistant Examiner* — Jonas T Beardsley
(74) *Attorney, Agent, or Firm* — Slater Matsil, LLP

(57) ABSTRACT

A method for producing at least one optoelectronic semiconductor component and an optoelectronic semiconductor component are disclosed. In an embodiment, the method includes providing a semiconductor layer sequence comprising a first semiconductor material configured to emit a first radiation and applying a conversion element at least partially on the semiconductor layer sequence via a cold method, wherein the conversion element comprises a second semiconductor material, and wherein the second semiconductor material is configured to convert the first radiation into a second radiation.

16 Claims, 3 Drawing Sheets

(56) References Cited

U.S. PATENT DOCUMENTS

| | | |
|---|---|---|
| 2011/0249468 A1 | 10/2011 | Moon |
| 2013/0244354 A1 | 9/2013 | Kundaliya et al. |
| 2013/0244408 A1* | 9/2013 | Moseley ................. C30B 23/02 438/478 |
| 2015/0155331 A1* | 6/2015 | Guenard ............... H01L 27/153 257/93 |
| 2015/0340561 A1 | 11/2015 | Bergbauer et al. |

* cited by examiner

METHOD FOR PRODUCING AT LEAST ONE OPTOELECTRONIC SEMICONDUCTOR COMPONENT AND OPTOELECTRONIC SEMICONDUCTOR COMPONENT

CROSS-REFERENCE TO RELATED APPLICATIONS

This application claims the benefit of U.S. Provisional Application No. 62/425,574, filed on Nov. 22, 2016, titled, "Method for Producing at Least One Optoelectronic Semiconductor Component and Optoelectronic Semiconductor Component", which application is hereby incorporated herein by reference.

TECHNICAL FIELD

A method for producing at least one optoelectronic semiconductor component is specified. Furthermore an optoelectronic semiconductor component is specified.

BACKGROUND

Semiconductor conversion elements having epitaxial layers can be used as light converting elements. Traditional conversion elements are mainly dielectric with a very wide band gaps (Eg>>5 eV) and not semiconductors. And, light conversion phenomenon is due to rare-earth activator ion doped into these dielectric materials. Typically indium-gallium-nitride (InGaN) blue LED is grown on sapphire via MOCVD thin film deposition method and traditional conversion elements are attached to the top surface of InGaN blue LED via adhesive. And, the conversion elements absorb the blue wavelength of an LED and converts into another wavelength depending on the rare-earth activator ion. The adhesive can be an organic material, for example silicone. The converting element is glued with silicone to the surface of the LED chip. However, this constitutes a thick glue interface between the LED chip and the traditional converter element. Such architecture does not prevent crosstalk in pixelated LED concepts and calls for a thinner interface between the LED chip and the converter element. One other idea is that the substrate, for example a wafer, that is used brought for conversion can be joined with the LED wafer by use of direct bonding or a wafer bonding that contains some additional material, for example, silicon dioxide-coated wafers. The thickness of the traditional conversion element also needs to be reduced in order to avoid cross talk in pixelated LED concepts.

SUMMARY

In accordance with at least one embodiment a method for producing at least one optoelectronic semiconductor component comprises providing a semiconductor layer sequence, which comprises a first semiconductor material, which emits a first radiation in operation, applying a conversion element at least partially on the semiconductor layer sequence via a cold method, wherein the conversion element comprises a second semiconductor material, and wherein the second semiconductor material converts the first radiation into a second radiation in operation.

In accordance with at least one embodiment the method for producing at least one optoelectronic semiconductor component, the method comprising: providing a semiconductor layer sequence, which was grown up or grown on a substrate and comprises a first semiconductor material, which emits a first radiation in operation, applying a conversion element at least partially on the semiconductor layer sequence via a cold method, wherein the conversion element comprises a second semiconductor material, and wherein the second semiconductor material converts the first radiation into a second radiation in operation.

According to one embodiment of the method, the method comprises the step of providing a semiconductor layer sequence. The optoelectronic semiconductor component can comprise one or a plurality of semiconductor layer sequences. The semiconductor layer sequence is preferably based on a III-V compound semiconductor material, here named as the first semiconductor material. The first semiconductor material is, for example, a nitride compound semiconductor material such as $Al_nIn_{1-n-m}Ga_mN$ or a phosphide compound semiconductor material such as $AlInIn_{1-n-m}Ga_mP$ or an arsenide compound semiconductor material such as $AlInIn_{1-n-m}Ga_mAs$, wherein in each case $0 \le n \le 1$, $0 \le m \le 1$ and $n+m \le 1$. In this case, the semiconductor layer sequence can comprise dopants and additional constituents. For the sake of simplicity, however, only the essential constituents of the crystal lattice of the semiconductor layer sequences, that is to say Al, As, Ga, In, N or P, are indicated, even if these can be replaced and/or supplemented in part by small amounts of further substances.

According to one embodiment the first semiconductor material is $Al_nIn_{1-n-m}Ga_mN$. n, m and n+m can be: $0 \le n \le 1$, $0 \le m \le 1$ and/or $n+m \le 1$.

The at least one semiconductor layer sequence can be grown. Particularly the semiconductor layer sequence is grown or was grown epitaxially on a substrate.

According to one embodiment the substrate is based on, for example, sapphire or other ceramics, glass, glass-like materials, glass ceramics or other transparent or translucent materials or consists of the same. Alternatively the substrate can be reflective, for example can comprise alumina, polycrystalline alumina, other ceramics, aluminum, other metals or alanod or consists of the same.

Particularly the substrate is a wafer or a pump wafer.

According to one embodiment the first semiconductor material can emit a first radiation in operation. Particularly the first radiation has a dominant wavelength of the blue and/or UV spectral range. The dominant wavelength is the wavelength of monochromatic light that would give the same visual sensation if combined in a suitable proportion with an achromatic light.

According to one embodiment the method comprises applying a conversion element on the semiconductor layer sequence. In particular the conversion element is applied on the surface facing away from the substrate on the semiconductor layer sequence. The conversion element is at least partially applied on the semiconductor layer sequence.

In an embodiment the conversion element is fully applied on the semiconductor layer sequence. The conversion element is applied via a cold method. Cold method means here and in the following that the method is performed at a maximum temperature of 550° C., in particular at a maximum temperature of 400° C., for example 380° C.

According to one embodiment the cold method is sputtering or pulse laser deposition. These methods are known to a person skilled in the art and are therefore not explained in detail.

The cold method can be an Aerosol Deposition Method (ADM) at room temperature. The cold method can be a pulse laser deposition (PLD). PLD can be performed from room temperature up to at least about 700° C. The cold method can be an Atomic layer epitaxy (ALE), which can be performed up to 600° C. The cold method can be a Plasma assisted (or enhanced) MOVPE at temperature between 200° C. to 600° C.

According to one embodiment the cold method can be performed up to 700° C., preferably below 550° C.

The inventors have found out that the application of the conversion element via a cold method results in an optoelectronic component which can be produced at reduced temperatures. This means that the semiconductor layer sequence is not destroyed by applying the conversion element.

According to one embodiment of the method the conversion element comprises a second semiconductor material. The semiconductor material can be selected from the group consisting of indium-gallium-nitride (InGaN), aluminium-gallium-indium-nitride (AlGaInN), aluminium-gallium-indium-arsenide-phosphide (AlGaInAsP).

According to one embodiment the second semiconductor material converts the first radiation into a second radiation in operation. The second radiation can have a dominant wavelength which is bigger than the dominant wavelength of the first radiation. Particularly the dominant wavelength of the second radiation lies in the red, green, yellow, orange spectral range.

According to one embodiment each of the first and the second semiconductor materials comprises indium. The indium content of the first semiconductor material is smaller than the indium content of the second semiconductor material. The semiconductor layer sequence can comprise or consist of indium-gallium-nitride. The indium content of indium-gallium-nitride of the semiconductor layer sequence is smaller than the indium content of the second semiconductor material which can also be indium-gallium-nitride. The content of indium influences the dominant wavelength of the first and/or second radiation. A low indium content of indium-gallium-nitride results in a first radiation of the blue spectral range. A higher indium content results in radiation of the yellow or red spectral range.

Epitaxial layers can be deposited on a pump wafer by sputtering or pulse laser deposition (PLV). Both techniques are potentially cold methods that allow deposition on wafers, especially partly processed or chip arrays. When indium-gallium-nitride is used, the possible amount of indium that can be deposited is much higher. Therefore green and red light can be made from indium-gallium-nitride.

According to one embodiment of the method the indium content of the second semiconductor material is between 30 atom % and 60 atom % (borders are included).

The inventors have found out that, by applying a conversion element via a cold method, a thin conversion element can be produced.

According to one embodiment the conversion element is formed as a layer having a layer thickness of 20 nm to 200 nm, particularly a thickness of 25 nm to 100 nm, for example 50 nm (borders are included).

According to one embodiment the conversion element is formed as a layer having a layer thickness of larger towards 500 nm. Thus the absorption can be enhanced. The layer thickness can be adapted depending on the desired color.

According to one embodiment of the method an arrangement can be formed after applying the conversion element. This arrangement can then be separated in order to form a plurality of optoelectronic semiconductor components. The arrangement can be placed on a wafer and can then be separated, for example by dicing.

According to one embodiment of the method the conversion element comprises a surface which is arranged facing away from the semiconductor layer sequence. Additionally or alternatively, the conversion element is structured. The conversion element can be structured with photolithographic steps to allow micropixel conversion.

According to one embodiment a conversion element comprises quantum well device architecture. Therefore very thin conversion elements or conversion layers can be produced.

According to one embodiment the optoelectronic semiconductor component emits white radiation in operation. The white radiation is the sum of the first radiation and the second radiation. Alternatively, the optoelectronic semiconductor component emits solely the second radiation, wherein the first radiation is fully converted into the second radiation. This concept is also called full conversion.

According to one embodiment the optoelectronic semiconductor component does not comprise an adhesive layer which glues the semiconductor layer sequence to the conversion element. In other words, the conversion element is applied directly on the semiconductor layer sequence without any adhesive layer. The absence of an adhesive layer results in a direct connection of the conversion element to the semiconductor layer sequence and will provide better thermal joint and a better thermal connection between the conversion element and the semiconductor layer sequence.

According to one embodiment the conversion element is applied on the whole surface of the semiconductor layer sequence. Then the conversion element is partially removed from the surface and a third semiconductor material is applied on the area of the removed conversion element. The third semiconductor material emits a third radiation in operation wherein the second and the third radiation are different from each other. Alternatively, the second and the third radiation have the same dominant wavelength.

According to one embodiment the second and/or third radiation has a dominant wavelength in the green or red spectral range. Therefore red and green pixels can be produced next to each other directly on the semiconductor layer sequence. This means that the second and third semiconductor materials are arranged in one plane. In contrast to this, in wafer bonding processes red and green pixels will be in different planes and will have, in a side view, different heights.

A common processing is anticipated since the conversion material class is similar to that of the semiconductor layer sequence. In other words, one could use the same materials, i.e., one would also use the same chemicals to get the same element. Thus the process simplifies. The Growths can be better as well.

According to one embodiment the conversion element is roughened. Therefore the out-coupling can be optimized.

According to one embodiment the optoelectronic semiconductor component comprises an absorbing layer. The absorbing layer can absorb blue radiation. The absorbing layer can be arranged on the conversion element. The absorbing layer can absorb the first radiation. This guarantees a pure color.

According to one embodiment the removing of the conversion element can be carried out via laser liftoff. The process of laser liftoff is known to a skilled person and is therefore not explained in detail.

The invention also claims an optoelectronic semiconductor component. The optoelectronic semiconductor component is particularly producible by means of the above-mentioned method. Therefore all embodiments and definitions mentioned for the method are also valid for the optoelectronic semiconductor component and vice versa.

BRIEF DESCRIPTION OF THE DRAWINGS

For a more complete understanding of the present invention, and the advantages thereof, reference is now made to the following descriptions taken in conjunction with the accompanying drawings.

A method for producing an optoelectronic semiconductor component and an optoelectronic semiconductor component are described in greater detail below on the basis of exemplary embodiments with reference to the drawings. In this case identical reference signs indicate identical elements in the individual figures. Relations to scale are not illustrated in this case. However, individual elements may be illustrated with an exaggerated size in order to afford a better understanding.

DETAILED DESCRIPTION OF ILLUSTRATIVE EMBODIMENTS

Figure 1A:
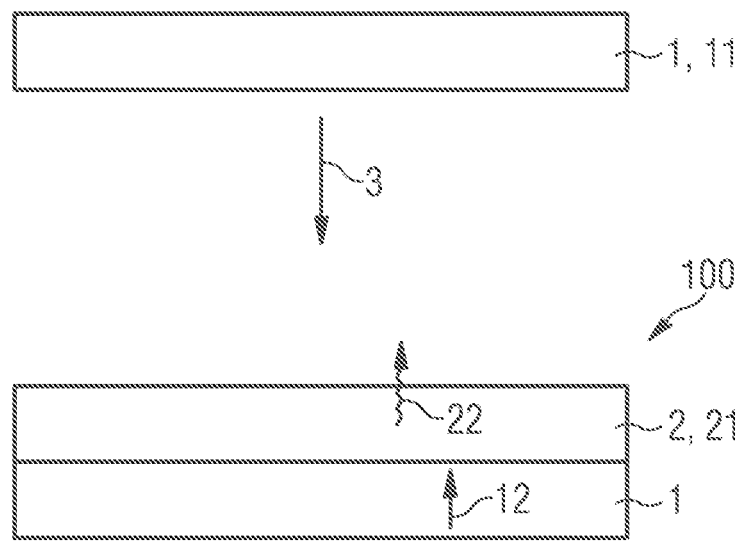
FIGS. 1A and 1B show schematic illustrations of methods for producing an optoelectronic semiconductor component described herein.

FIG. 1 schematically shows an exemplary embodiment of a method for producing at least one optoelectronic semiconductor component. At first a semiconductor layer sequence 1 comprising a first semiconductor material 11 is provided. The first semiconductor material can be an epitaxial material, for example indium-gallium-nitride (InGaN). The first semiconductor material can emit a first radiation in operation, for example having a dominant wavelength of the blue spectral range. Via a cold method 3 a conversion element 2 is applied. A conversion element 2 is at least partially applied on the semiconductor layer sequence 1, particularly on the radiation surface of the semiconductor layer sequence. Alternatively, the conversion element 2 is fully applied on the semiconductor layer sequence 1. The conversion element 2 comprises a second semiconductor material 21 having a second radiation 22 with a dominant wavelength which is bigger than a dominant wavelength of the first radiation 12. The second semiconductor material 21 can also be indium-gallium-nitride, but the indium content of the second semiconductor material is bigger than the indium content of the first semiconductor material 11. The indium content of the second semiconductor material 21 can be between 30 atom % and 60 atom %, for example 50 atom %.

At least one optoelectronic semiconductor component 100 results from such described method.

Figure 1B:
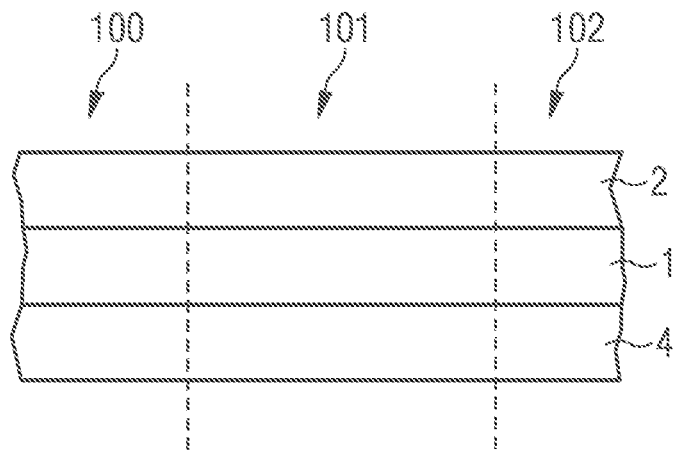

FIG. 1B shows a schematic exemplary embodiment of optoelectronic semiconductor components 100, 101, 102. The arrangement which results after the application step of the conversion element can be separated in order to form a plurality of optoelectronic semiconductor components 100, 101 and 102. The first semiconductor material can be grown on a substrate 4, for example a sapphire wafer. The sapphire wafer can be removed later on.

Figure 2A:
FIGS. 2A and 2B show schematic sectional illustrations of exemplary embodiments of optoelectronic semiconductor components described herein.

FIG. 2A shows an exemplary embodiment of an optoelectronic semiconductor component as it is known from the prior art. The semiconductor component comprises a semiconductor layer sequence 1 which is glued to a conversion element 2 via an adhesive layer 5. The adhesive layer can be silicone. This adhesive layer is very thick and thus does not prevent crosstalk in pixelated LED concepts. Therefore thinner architectures are needed. This is achieved by a method according to claim 1 or an optoelectronic semiconductor component according to claim 18.

Figure 2B:
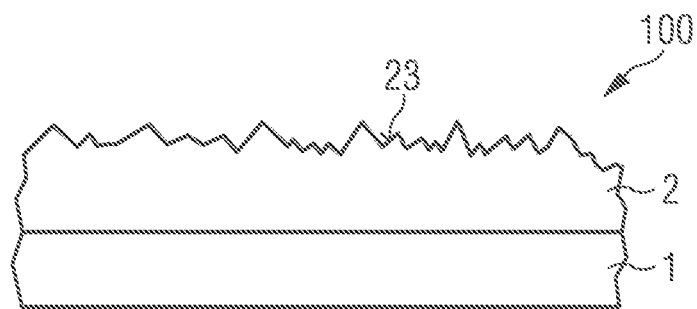

FIG. 2B schematically shows an exemplary embodiment of an optoelectronic semiconductor component 100 described herein. This optoelectronic semiconductor component 100 differs from the component according to FIG. 1A in the surface 23 of the conversion element 2. The surface 23 of the conversion element 2 is structured. The structure can be made by photolithographic steps. Therefore micropixel conversion can be allowed.

Figure 3A:
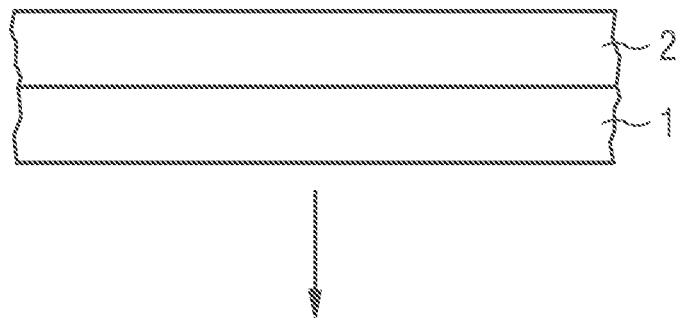
FIGS. 3A to 3C show a schematic illustration of a method for producing an optoelectronic semiconductor component described herein.
Figure 3B:
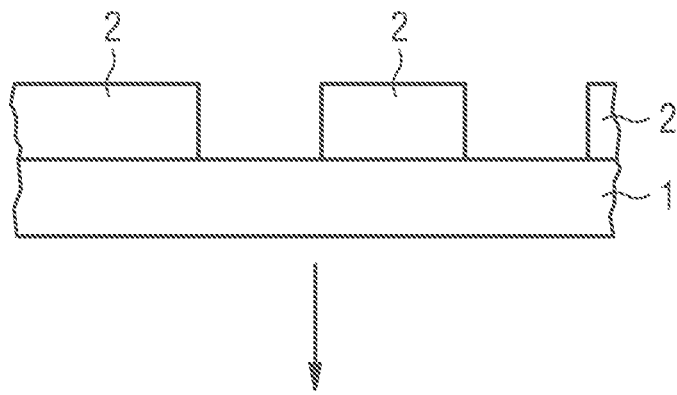
Figure 3C:
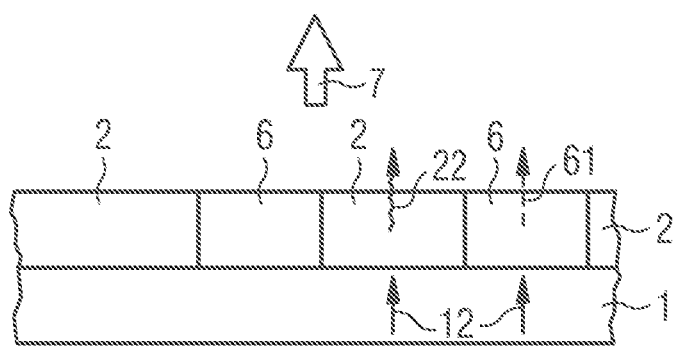

FIGS. 3A to 3C show an exemplary embodiment of a method for producing an optoelectronic semiconductor component 100. FIG. 3A shows a semiconductor layer sequence 1 and a conversion element 2 which is directly arranged on a semiconductor layer sequence 1. After the conversion element 2 is applied on the whole surface of the semiconductor layer sequence 1, the conversion element 2 is partially removed, especially in stripes, from the surface of the semiconductor layer sequence 1 (see FIG. 3B). After that a third semiconductor material 6 can be applied on the area of the removed conversion element 2, wherein the third semiconductor material 6 emits a third radiation in operation. Particularly, the second and the third radiations are different from each other. For example the second radiation comprises the dominant wavelength of the red spectral range and the third radiation can have a dominant wavelength of the green spectral range. Therefore red and green pixels can be produced next to each other directly on the semiconductor layer sequence 1 at the same height or in one plane.

The semiconductor layer sequence 1 can emit blue radiation and the conversion element 2 can emit red or green radiation and the third semiconductor material 6 can emit green or red radiation so that the optoelectronic semiconductor component 100 emits white radiation in operation, here denoted as 7.

The invention is not restricted by the description on the basis of the exemplary embodiments. Rather, the invention encompasses any novel features and also any combination of the features, which in particular includes any combination of features in the patent claims even if this feature or this combination itself is not explicitly specified in the patent claims or exemplary embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for producing at least one optoelectronic semiconductor component, the method comprising:
   providing a semiconductor layer sequence comprising a first semiconductor material configured to emit a first radiation; and
   forming a conversion element at least partially on a surface of the semiconductor layer sequence via a cold method, wherein the cold method is selected from the group consisting of a sputtering deposition, a pulsed laser deposition (PLD), an aerosol deposition (ADM) and an atomic layer epitaxy (ALE), wherein the conversion element comprises a second semiconductor material with an indium content between 30 atom % and 60 atom % inclusive, and wherein the second semiconductor material is configured to convert the first radiation into a second radiation;

after forming the conversion element, partially removing the conversion element from the surface of the semiconductor layer sequence; and after partially removing the conversion element, applying a third semiconductor material on an area of the semiconductor layer sequence from which the conversion element has been partially removed, wherein the third semiconductor material is configured to emit a third radiation, wherein the second and the third radiations are different from each other, and wherein the second semiconductor material and the third semiconductor material are in contact with the semiconductor layer sequence.

2. The method according to claim 1, wherein the first semiconductor material comprises indium, and wherein an indium content of the first semiconductor material is smaller than the indium content of the second semiconductor material.

3. The method according to claim 1, wherein the conversion element is formed as a layer having a layer thickness of 20 nm to 200 nm.

4. The method according to claim 1, wherein the cold method is performed at a maximum temperature of 550° C.

5. The method according to claim 1, wherein the cold method comprises the sputtering deposition or the pulsed laser deposition.

6. The method according to claim 1, wherein the second semiconductor material is selected from the group consisting of InGaN, AlGaInN and AlGaInAsP.

7. The method according to claim 1, wherein the semiconductor layer sequence is grown epitaxially on a substrate.

8. The method according to claim 1, wherein the first semiconductor material is $Al_n In_{1-n-m} Ga_m N$ with $0 \leq n \leq 1$, $0 \leq m \leq 1$ and/or $n+m \leq 1$.

9. The method according to claim 1, wherein the first radiation has a dominant wavelength of a blue spectral range and/or a UV spectral range.

10. The method according to claim 1, wherein the second radiation has a dominant wavelength which is larger than a dominant wavelength of the first radiation.

11. The method according to claim 1, further comprising separating an arrangement of the first, second and third semiconductor materials in order to form a plurality of optoelectronic semiconductor components.

12. The method according to claim 1, wherein the conversion element comprises a structured surface that faces away from the semiconductor layer sequence.

13. The method according to claim 1, wherein the optoelectronic semiconductor component is configured to emit white radiation.

14. The method according to claim 1, wherein no adhesive layer is arranged between the conversion element and the semiconductor layer sequence.

15. The method according to claim 1, wherein partially removing of the conversion element is carried out via laser lift-off.

16. An optoelectronic semiconductor component produced according to the method of claim 1.

* * * * *